(12) United States Patent
Maeta et al.

(10) Patent No.: US 10,153,192 B2
(45) Date of Patent: Dec. 11, 2018

(54) ELECTROSTATIC CHUCK DEVICE

(71) Applicant: SUMITOMO OSAKA CEMENT CO., LTD., Tokyo (JP)

(72) Inventors: Shinichi Maeta, Tokyo (JP); Yukio Miura, Tokyo (JP); Mamoru Kosakai, Tokyo (JP); Hitoshi Kouno, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 0 days.

(21) Appl. No.: 15/762,056

(22) PCT Filed: Sep. 13, 2016

(86) PCT No.: PCT/JP2016/076944
§ 371 (c)(1),
(2) Date: Mar. 21, 2018

(87) PCT Pub. No.: WO2017/051748
PCT Pub. Date: Mar. 30, 2017

(65) Prior Publication Data
US 2018/0269097 A1 Sep. 20, 2018

(30) Foreign Application Priority Data

Sep. 25, 2015 (JP) .................................. 2015-188377
Sep. 25, 2015 (JP) .................................. 2015-188378

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32642* (2013.01); *H01J 37/32724* (2013.01);
(Continued)

(58) Field of Classification Search
CPC ............ H01L 21/6833; H01J 37/32642; H01J 37/32724
See application file for complete search history.

(56) References Cited

U.S. PATENT DOCUMENTS

| | | | |
|---|---|---|---|
| 5,919,332 A * | 7/1999 | Koshiishi | ............ C23C 16/5096 |
| | | | 118/723 E |
| 9,093,487 B2 | 7/2015 | Nagai | |
| 2005/0042881 A1* | 2/2005 | Nishimoto | ........ H01L 21/67248 |
| | | | 438/710 |

(Continued)

FOREIGN PATENT DOCUMENTS

| | | |
|---|---|---|
| JP | 2003-179129 A | 6/2003 |
| JP | 2007-027494 A | 2/2007 |

(Continued)

OTHER PUBLICATIONS

International Search Report for PCT/JP2016/076944 (dated Nov. 1, 2016).

(Continued)

*Primary Examiner* — Scott Bauer
(74) *Attorney, Agent, or Firm* — Merchant & Gould P.C.

(57) ABSTRACT

An electrostatic chuck device according to the present invention includes: an electrostatic chuck portion having a placement surface on which a plate-like sample is placed; a base portion for temperature adjustment disposed in opposition to the side of the electrostatic chuck portion on the opposite side from the placement surface; a bonding portion for bonding the electrostatic chuck portion and the base portion for temperature adjustment together; and an annular focus ring surrounding the periphery of the placement surface, in which the volume of a space surrounded by the electrostatic chuck portion, the focus ring, the bonding portion, and a dam portion of the base portion for temperature adjustment is greater than the amount of volume expansion of the bonding portion at the working temperature.

11 Claims, 3 Drawing Sheets

(52) U.S. Cl.
CPC ... *H01J 2237/002* (2013.01); *H01J 2237/334* (2013.01); *H01L 21/67069* (2013.01)

(56) References Cited

U.S. PATENT DOCUMENTS

| | | | |
|---|---|---|---|
| 2007/0144442 A1 | 6/2007 | Migita | |
| 2008/0210379 A1* | 9/2008 | Miyagawa | H01J 37/32623 156/345.51 |
| 2009/0294064 A1* | 12/2009 | Nagayama | H01J 37/32623 156/345.39 |
| 2010/0012274 A1* | 1/2010 | Miyagawa | H01J 37/32623 156/345.37 |
| 2011/0058303 A1* | 3/2011 | Migita | H01L 21/6833 361/234 |
| 2014/0069585 A1 | 3/2014 | Aoto et al. | |

FOREIGN PATENT DOCUMENTS

| | | |
|---|---|---|
| JP | 2007-110023 A | 4/2007 |
| JP | 2007-194616 A | 8/2007 |
| JP | 2008-300491 A | 12/2008 |
| JP | 2011-108816 A | 6/2011 |
| JP | 2013-247342 A | 12/2013 |
| JP | 2013-258270 A | 12/2013 |
| JP | 2014-053481 A | 3/2014 |
| JP | 2015-159232 A | 9/2015 |

OTHER PUBLICATIONS

Notice of Allowance for Japanese Patent Application No. 2016-564342 (dated Feb. 7, 2017).

* cited by examiner

ELECTROSTATIC CHUCK DEVICE

This application is a National Stage Application under 35 U.S.C. § 371 of International Application No. PCT/JP2016/076944 filed Sep. 13, 2016, which claims the benefit of priority to Japanese Patent Application No. 2015-188377 filed on Sep. 25, 2015 and Japanese Patent Application No. 2015-188378 filed on Sep. 25, 2015, the disclosures of all of which are hereby incorporated by reference in their entireties. The International Application was published in Japanese on Mar. 30, 2017 as WO 2017/051748.

TECHNICAL FIELD

The present invention relates to an electrostatic chuck device.

This application claims the right of priority based on Japanese Patent Application No. 2015-188377 filed on Sep. 25, 2015 and Japanese Patent Application No. 2015-188378 filed on Sep. 25, 2015, the entire contents of which are incorporated herein by reference.

BACKGROUND

In a semiconductor manufacturing apparatus using plasma, such as a plasma etching apparatus or a plasma CVD apparatus, in the past, as a device for easily mounting and fixing a wafer to a sample stage and maintaining the temperature of the wafer at a desired temperature, an electrostatic chuck device has been used.

As such an electrostatic chuck device, for example, an electrostatic chuck device in which an electrostatic chuck portion having a plate-like electrode for electrostatic chucking embedded therein and a base portion for temperature adjustment having a coolant flow path for coolant circulation formed therein are joined and integrated together by a bonding portion is known (Patent Literature No. 1).

The bonding portion is easily corroded by radicals or the like generated during plasma treatment. For this reason, if the electrostatic chuck is used under a plasma environment for a long time, there is a case where the bonding portion is corroded.

If the bonding portion is corroded by the plasma, the adhesive strength between the electrostatic chuck portion and the base portion for temperature adjustment decreases. There is a concern that a decrease in adhesive force may result in a reduction in the life of a product, warping of a member, or the like. Further, since the heat transferability of the portion corroded by the plasma deteriorates, non-uniformity of the temperature of a wafer can be caused.

For the purpose of preventing such corrosion of the bonding portion, for example, Patent Literature No. 2 discloses an electrostatic chuck device provided with an electrostatic chuck having a concavo-convex shape on a side surface, and a ring-shaped insulation ring fitted to the concavo-convex shape and disposed on the outer periphery of the electrostatic chuck.

Further, Patent Literature No. 3 discloses a substrate placing table having a base having a recess portion and an electrostatic chuck portion which is fitted to the recess portion, in which an adhesive layer is provided on only the flat surface of a bottom portion of the recess portion.

Further, in order to avoid corrosion of a bonding portion by radicals or the like generated during plasma treatment, a substrate placing table having a base having a recess portion and an electrostatic chuck portion which is fitted to the recess portion, in which an adhesive layer is provided on only the flat surface of a bottom portion of the recess portion, has been proposed (Patent Literature No. 3).

Further, in recent years, in a plasma etching apparatus, according to finer wiring or the like of a semiconductor device, uniformity of an etching rate has been more severely required than that in the past. The etching rate by plasma etching is affected by the density of plasma, the surface temperature of a wafer, the concentration distribution of an etching gas, or the like. The plasma density or the etching gas concentration has a density or concentration distribution on the surface of the wafer, and therefore, in addition to the uniformity of the wafer surface temperature, adjustment of the in-plane temperature distribution of the wafer is required.

Therefore, an electrostatic chuck device with a heater function, in which a heater member is mounted between an electrostatic chuck portion and a base portion for temperature adjustment, has been proposed (Patent Literature No. 4).

This electrostatic chuck device with a heater function can locally create a temperature distribution in a wafer, and therefore, it is possible to appropriately set the in-plane temperature distribution of the wafer in accordance with a plasma etching rate.

CITATION LIST

Patent Literature

[Patent Literature No. 1] Japanese Laid-open Patent Publication No. 2013-247342
[Patent Literature No. 2] Japanese Laid-open Patent Publication No. 2003-179129
[Patent Literature No. 3] Japanese Laid-open Patent Publication No. 2011-108816
[Patent Literature No. 4] Japanese Laid-open Patent Publication No. 2008-300491

SUMMARY OF INVENTION

Technical Problem

However, in the electrostatic chuck devices of the related art, there is a problem in that the influence of the plasma on the bonding portion cannot be sufficiently suppressed.

For example, in the electrostatic chuck device disclosed in Patent Literature No. 2, a gap is present between the insulation ring and the electrostatic chuck. Radicals which are generated by the plasma treatment reach the bonding portion through the gap and cause corrosion of the bonding portion.

For example, in the substrate placing table disclosed in Patent Literature No. 3, when the electrostatic chuck portion has been fitted to the base, the side surface of the electrostatic chuck portion is in direct contact with the base. In the electrostatic chuck device, the electrostatic chuck portion is heated and the base is cooled. For this reason, large distortion according to a difference in coefficient of thermal expansion occurs in the interface between the cooled base and the heated electrostatic chuck portion. This distortion may create a gap between the base and the electrostatic chuck portion or damage the base or the electrostatic chuck portion. Radicals which are generated by the plasma treatment reach the bonding portion through the gap and a clearance caused by breakage and cause corrosion of the bonding portion.

Further, in a configuration in which the electrostatic chuck portion is fitted to the base portion for temperature adjustment, there is room for improvement in terms of making the surface temperature in the wafer surface uniform and improving the processing accuracy of the wafer. For this reason, an electrostatic chuck device capable of further improving the temperature uniformity of a wafer is required.

The present invention has been made in view of the above problems and has an object to provide an electrostatic chuck device in which a bonding portion is prevented from being corroded in a plasma process and plasma resistance is high. Further, the present invention has an object to provide an electrostatic chuck device having a high temperature uniformity in an in-plane direction.

Solution to Problem

The present invention has the following configurations as means for solving the above problems.

An electrostatic chuck device according to a first aspect of the present invention includes: an electrostatic chuck portion having a placement surface on which a plate-like sample is placed and an internal electrode for electrostatic chucking; a base portion for temperature adjustment arranged opposite to the side of the electrostatic chuck portion on the opposite side from the placement surface; a bonding portion that bonds the electrostatic chuck portion and the base portion for temperature adjustment; and an annular focus ring that surrounds the periphery of the placement surface; in which the base portion for temperature adjustment has a flat portion on which the electrostatic chuck portion is placed, and a dam portion surrounding the periphery of the electrostatic chuck portion, the focus ring is arranged extending across the electrostatic chuck portion and the dam portion when viewed from overhead, the bonding portion bonds the dam portion and the side of the electrostatic chuck portion, the upper surface of the bonding portion between the dam portion and the electrostatic chuck portion is arranged below the upper surface of the electrostatic chuck portion and the dam portion, a space is formed surrounded by the electrostatic chuck portion, the focus ring, the bonding portion and the dam portion, and the volume of the space is greater than the amount of volume expansion of the bonding portion at the working temperature.

In the electrostatic chuck device according to the first aspect of the present invention, the distance from the upper surface of the electrostatic chuck portion to the upper surface of the bonding portion may be 0.1 mm or more.

In the electrostatic chuck device according to the first aspect of the present invention, the upper surface of the electrostatic chuck portion may be arranged above the upper surface of the dam portion, and the focus ring may be supported by the upper surface of the peripheral edge of the electrostatic chuck portion.

In the electrostatic chuck device according to the first aspect of the present invention, the bonding portion may have a first region between the electrostatic chuck portion and the flat portion and a second region between the electrostatic chuck portion and the dam portion, and Young's modulus of the second region may be smaller than Young's modulus of the first region.

In the electrostatic chuck device according to the first aspect of the present invention, thermal conductivity of the second region maybe lower than thermal conductivity of the first region.

An electrostatic chuck device according to a second aspect of the present invention includes: an electrostatic chuck portion having a placement surface on which a plate-like sample is placed and an internal electrode for electrostatic chucking; a base portion for temperature adjustment arranged in opposition to the side of the electrostatic chuck portion on the opposite side from the placement surface; and a bonding portion that bonds the electrostatic chuck portion and the base portion for temperature adjustment; in which the base portion for temperature adjustment has a flat portion on which the electrostatic chuck portion is placed, and a dam portion surrounding the periphery of the electrostatic chuck portion, the bonding portion is arranged extending from between the electrostatic chuck portion and the flat portion to between the electrostatic chuck portion and the dam portion, and in the bonding portion, thermal conductivity of a first region between the electrostatic chuck portion and the flat portion is higher than thermal conductivity of a second region between the electrostatic chuck portion and the dam portion in the bonding portion.

In the electrostatic chuck device according to the second aspect of the present invention, the first region of the bonding portion has a filler, while the second region of the bonding portion does not have a filler.

In the electrostatic chuck device according to the second aspect of the present invention, Young's modulus of the second region of the bonding portion maybe smaller than Young's modulus of the first region of the bonding portion.

The electrostatic chuck device according to the second aspect of the present invention may further include: a focus ring arranged above the electrostatic chuck portion and the dam portion and provided around the placement surface along the circumferential direction of the placement surface, in which the upper surface of the bonding portion in the second region may be arranged below the upper surface of the electrostatic chuck portion and the upper surface of the dam portion.

In the electrostatic chuck device according to an aspect of the present invention, the upper surface of the electrostatic chuck portion may be arranged above the upper surface of the dam portion, and the focus ring may be supported by the upper surface of the peripheral edge of the electrostatic chuck portion.

In the electrostatic chuck device according to the second aspect of the present invention, a space maybe formed surrounded by the electrostatic chuck portion, the focus ring, the bonding portion and the dam portion, and the volume of the space may be greater than the amount of volume expansion of the bonding portion at the working temperature.

Advantageous Effects of Invention

In the electrostatic chuck device according to the present invention, it is possible to suppress corrosion of the bonding portion by radicals which are generated during plasma treatment. Further, in the electrostatic chuck device according to the present invention, it is possible to even further improve the temperature uniformity of the wafer.

DESCRIPTION OF EMBODIMENTS

Hereinafter, the present invention will be described based on embodiments shown in the accompanying drawings.

The embodiments are for specifically describing the present invention in order to make the gist of the invention better understood and do not limit the present invention unless otherwise specified.

[First Embodiment]
(Electrostatic Chuck Device)

Figure 1:
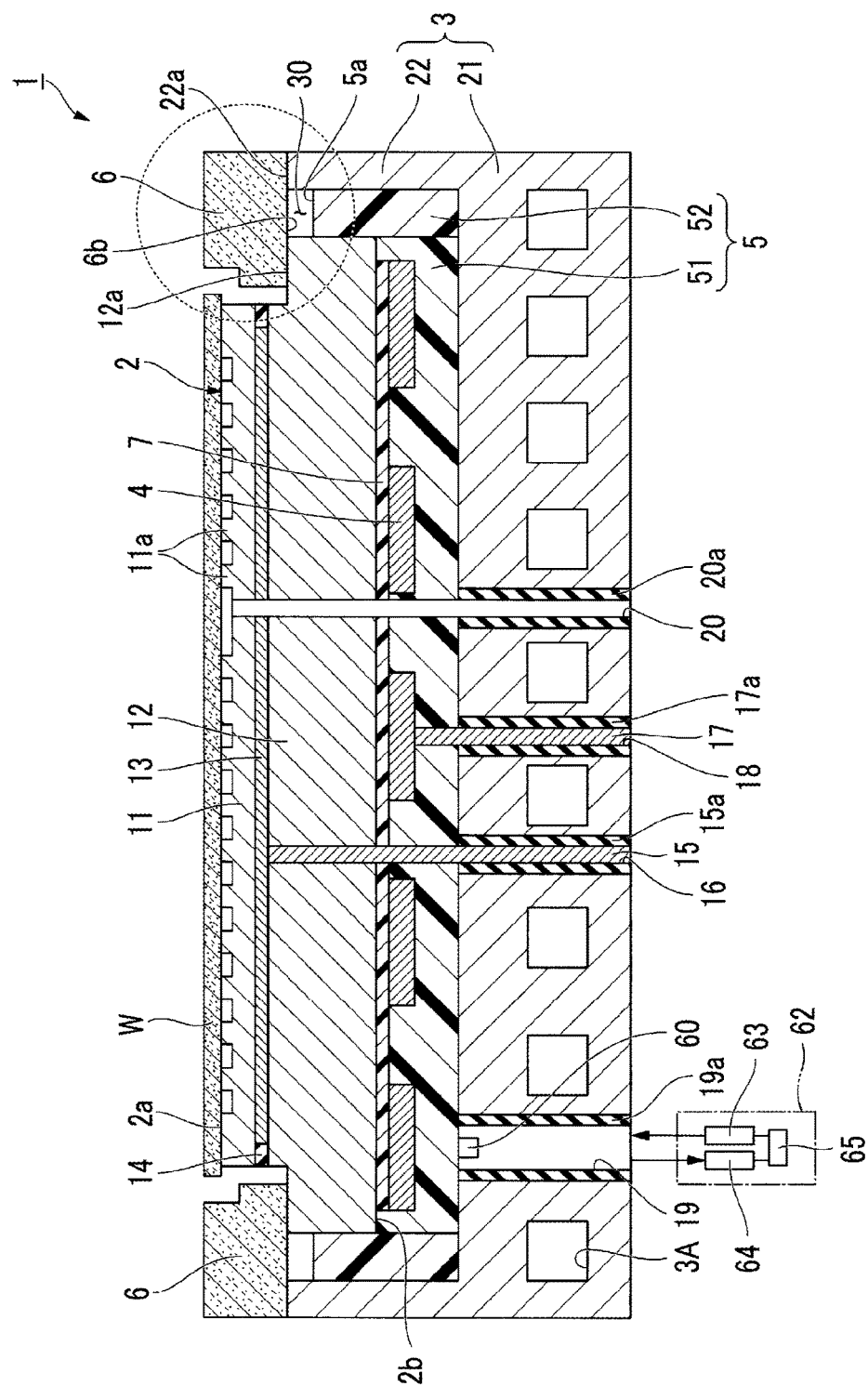
FIG. 1 is a sectional view showing a preferred example of an electrostatic chuck device according to a first embodiment and a third embodiment of the present invention.

FIG. 1 is a sectional view showing an electrostatic chuck device of a first embodiment which is a preferred example of the present invention. An electrostatic chuck device 1 of this embodiment is provided with an electrostatic chuck portion 2, a base portion for temperature adjustment 3, a heater element 4, a bonding portion 5, and a focus ring 6.

The electrostatic chuck portion 2 has a placing plate 11, a supporting plate 12, an electrode for electrostatic chucking (an internal electrode for electrostatic chucking) 13, and an insulating material layer 14. The placing plate 11 has, on the upper surface thereof, a placement surface on which a plate-like sample W such as a semiconductor wafer is placed. The supporting plate 12 is integrated with the placing plate 11 and supports the bottom portion side of the placing plate 11. The electrode for electrostatic chucking (internal electrode for electrostatic chucking) 13 is provided between the placing plate 11 and the supporting plate 12. The insulating material layer 14 insulates the periphery of the electrode for electrostatic chucking 13. In the electrostatic chuck portion 2, the surface on the side on which the plate-like sample W is placed is referred to as a first surface $2a$, and the surface on the side opposite thereto is referred to as a second surface $2b$.

The placing plate 11 and the supporting plate 12 have disk shapes in which the superimposed surfaces have the same shape. Each of the placing plate 11 and the supporting plate 12 is made of an insulating ceramic sintered compact having mechanical strength and having durability against corrosive gas and plasma thereof. For example, an aluminum oxide-silicon carbide ($Al_2O_3$—SiC) compound sintered compact, an aluminum oxide ($Al_2O_3$) sintered compact, an aluminum nitride (AlN) sintered compact, an yttrium oxide ($Y_2O_3$) sintered compact, or the like can be used.

A plurality of protrusion portions $11a$ each having a diameter smaller than the thickness of the plate-like sample W are formed at predetermined intervals on the first surface $2a$ of the placing plate 11, and these protrusion portions $11a$ support the plate-like sample W.

The total thickness including the placing plate 11, the supporting plate 12, the electrode for electrostatic chucking 13, and the insulating material layer 14, that is, the thickness of the electrostatic chuck portion 2 is formed to be 0.7 mm or more and 5.0 mm or less, as an example.

For example, if the thickness of the electrostatic chuck portion 2 is 0.7 mm or more, it is possible to secure the mechanical strength of the electrostatic chuck portion 2. If the thickness of the electrostatic chuck portion 2 is 5.0 mm or less, the heat capacity of the electrostatic chuck portion 2 does not become too large, and thus the thermal responsiveness of the plate-like sample W which is placed thereon does not deteriorate. That is, the heat transfer in a lateral direction of the electrostatic chuck portion 2 decreases, and thus it is possible to maintain the in-plane temperature of the plate-like sample W at a desired temperature pattern. The thickness of each part described here is an example and is not limited to the range.

The electrode for electrostatic chucking 13 is used as an electrode for an electrostatic chuck for generating electric charges and fixing the plate-like sample W with an electrostatic chucking force. The shape or size of the electrode for electrostatic chucking 13 is appropriately adjusted according to a use thereof.

It is preferable that the electrode for electrostatic chucking 13 is formed of high melting point metal. As the high melting point metal, conductive ceramic such as an aluminum oxide-tantalum carbide ($Al_2O_3$—TaC) conductive compound sintered compact, an aluminum oxide-tungsten ($Al_2O_3$—W) conductive compound sintered compact, an aluminum oxide-silicon carbide ($Al_2O_3$—SiC) conductive compound sintered compact, an aluminum nitride-tungsten (AlN—W) conductive compound sintered compact, an aluminum nitride-tantalum (AlN—Ta) conductive compound sintered compact, or an yttrium oxide-molybdenum ($Y_2O_3$—Mo) conductive compound sintered compact, or tungsten (W), tantalum (Ta), molybdenum (Mo), or the like can be used. These may be used alone or in combination of two or more.

The thickness of the electrode for electrostatic chucking 13 can be arbitrarily selected and is not particularly limited. However, for example, a thickness of 0.1 µm or more and 100 µm or less can be selected, and a thickness of 5 µm or more and 20 µm or less is more preferable.

If the thickness of the electrode for electrostatic chucking 13 is 0.1 µm or more, sufficient electrical conductivity can be secured. If the thickness of the electrode for electrostatic chucking 13 is 100 µm or less, peeling or cracking due to a difference in coefficient of thermal expansion between the electrode for electrostatic chucking 13, and the placing plate 11 and the supporting plate 12 does not easily occur in the joint interface between the electrode for electrostatic chucking 13, and the placing plate 11 and the supporting plate 12.

The electrode for electrostatic chucking 13 having such a thickness can be easily formed by a film formation method such as a sputtering method or a vapor deposition method, or a coating method such as a screen printing method.

The insulating material layer 14 surrounds the electrode for electrostatic chucking 13 to protect the electrode for electrostatic chucking 13 from corrosive gas and plasma thereof. Further, the insulating material layer 14 joins and integrates a boundary portion between the placing plate 11 and the supporting plate 12, that is, an outer peripheral portion region except for the electrode for electrostatic chucking 13. The insulating material layer 14 is configured of an insulating material having the same composition or the same main component as the material configuring the placing plate 11 and the supporting plate 12.

A power supply terminal 15 for applying a direct-current voltage to the electrode for electrostatic chucking 13 is connected to the electrode for electrostatic chucking 13. The power supply terminal 15 is inserted into a through-hole 16 which penetrates the base portion for temperature adjustment 3, the bonding portion 5, and the supporting plate 12 in a thickness direction. An insulator $15a$ having insulation properties is provided on the outer periphery side of the power supply terminal 15. The power supply terminal 15 is insulated from the metallic base portion for temperature adjustment 3 by the insulator 15a.

In the drawing, the power supply terminal 15 is shown as an integral member. However, a plurality of members may be electrically connected to configure the power supply terminal 15. The power supply terminal 15 is inserted into the base portion for temperature adjustment 3 and the supporting plate 12 having coefficients of thermal expansion different from each other. For this reason, for example, the portions inserted into the base portion for temperature adjustment 3 and the supporting plate 12 may be configured of materials different from each other.

As a material of the portion (an extraction electrode) connected to the electrode for electrostatic chucking 13 and inserted into the supporting plate 12, of the power supply terminal 15, a conductive material having excellent heat resistance can be used. Among the conductive materials having excellent heat resistance, a conductive material having a coefficient of thermal expansion close to the coefficients of thermal expansion of the electrode for electrostatic chucking 13 and the supporting plate 12 is preferable. For example, the portion is made of a conductive ceramic material such as $Al_2O_3$ —TaC.

As the portion inserted into the base portion for temperature adjustment 3, of the power supply terminal 15, a portion made of a metal material such as tungsten (W), tantalum (Ta), molybdenum (Mo), niobium (Nb), a kovar alloy, or the like can be used.

These two members are preferably connected to each other with a silicone-based conductive adhesive having flexibility and conductivity.

The heater element 4 heats the plate-like sample W placed on the electrostatic chuck portion 2. The heater element 4 is bonded to the second surface 2b of the electrostatic chuck portion 2 through an adhesive layer 7. A power supply terminal 17 is connected to the heater element 4. The heater element 4 generates heat by being energized through the power supply terminal 17. As the adhesive layer 7, a sheet-shaped or film-shaped resin having heat resistance, such as polyimide resin, epoxy resin, or acrylic resin, can be used.

The heater element 4 is made of a band-like member disposed within a predetermined circular region. The band-like member forms a heater pattern within a predetermined circular region.

The heater pattern of the heater element 4 may be formed of only one heater or may be formed using two or more independent heaters.

In a case of using two or more independent heaters, it is preferable to dispose other heaters on concentric circles so as to sequentially surround a first heater disposed in an annular region of a central portion.

The heater configuring the heater element 4 is made of a nonmagnetic metal thin plate having a constant thickness of 0.2 mm or less, preferably about 0.1 mm, as an example. As the nonmagnetic metal thin plate, for example, a titanium (Ti) thin plate, a tungsten (W) thin plate, a molybdenum (Mo) thin plate, or the like can be used. The heater is obtained by processing the nonmagnetic metal thin plate into a desired heater shape by a photolithography method, for example, by processing the whole contour of the meandering shape of a band-like heater into an annular shape.

In a case where the heater element 4 is composed of a plurality of heaters, a plurality of power supply terminals 17 for supplying power to these individual heaters are provided. In FIG. 1, for simplicity of description, only one power supply terminal 17 is drawn.

The power supply terminal 17 is disposed so as to partially penetrate the base portion for temperature adjustment 3 and the bonding portion 5 in the thickness direction thereof. The power supply terminal 17 is disposed in a through-hole 18 for supplying power to the heater element 4, as described above. An insulator 17a for insulation is provided on the outer peripheral surface of the power supply terminal 17, so that the base portion for temperature adjustment 3 and the power supply terminal 17 are insulated from each other.

As a material configuring the power supply terminal 17, the same material as the material configuring the power supply terminal 15 described above can be used.

The base portion for temperature adjustment 3 adjusts the temperature of the electrostatic chuck portion 2 to a desired temperature. The base portion for temperature adjustment 3 is disposed to face the second surface 2b of the electrostatic chuck portion 2.

The base portion for temperature adjustment 3 has a flat portion 21 on which the electrostatic chuck portion 2 is placed, and a dam portion 22 surrounding the periphery of the electrostatic chuck portion 2.

For example, a flow path 3A through which a coolant is circulated may be formed in the base portion for temperature adjustment 3.

As a material configuring the base portion for temperature adjustment 3, metal which has excellent thermal conductivity, electric conductivity, and workability, or a compound material which includes the metal can be used. Further, it is preferable to use a nonmagnetic material for a conductive material having excellent heat resistance. For example, aluminum (Al), an aluminum alloy, copper (Cu), a copper alloy, nonmagnetic stainless steel (SUS), or the like is suitably used. It is preferable that at least the surface which is exposed to plasma, of the base portion for temperature adjustment 3, is subjected to alumite treatment or has an insulating film such as alumina formed thereon.

Further, the base portion for temperature adjustment 3 has a plurality of through-holes penetrating in the thickness direction. The through-holes are classified broadly into four types of through-holes; the through-hole 16 for supplying power to the electrode for electrostatic chucking 13, the through-hole 18 for supplying power to the heater element 4 (described later), an installation hole 19 for installing a temperature sensor, and a pin insertion hole 20 for inserting a lift pin. The insulators 15a, 17a, and 19a for insulating the conductive members inserted into the through-holes from the base portion for temperature adjustment 3 are provided on the outer peripheries of these through-holes.

The electrostatic chuck portion 2 and the flat portion 21 of the base portion for temperature adjustment 3, and the electrostatic chuck portion 2 and the dam portion 22 of the base portion for temperature adjustment 3 are bonded to each other by the bonding portion 5.

An upper surface 5a of the bonding portion 5 between the electrostatic chuck portion 2 and the dam portion 22 of the base portion for temperature adjustment 3 is disposed further on the lower side than an upper surface 22a of the dam portion 22 and an upper surface 12a of the electrostatic chuck portion 2.

The resin configuring the bonding portion 5 causes a volume change due to thermal expansion. The upper surface 5a of the bonding portion 5 is disposed further on the lower side than the upper surface 22a of the dam portion 22 and the upper surface 12a of the electrostatic chuck portion 2, whereby even at the time of thermal expansion, protrusion of the resin configuring the bonding portion 5 from a gap which is formed by the electrostatic chuck portion 2 and the dam portion 22 can be suppressed.

As the material for the bonding portion 5, silicone resin, acrylic resin, polyimide resin, or the like can be used. The bonding portion 5 does not need to be made of one material, and a different material may be used for each region.

For example, as shown in FIG. 1, the region between the electrostatic chuck portion 2 and the flat portion 21 is set as a first region 51 and the region between the electrostatic chuck portion 2 and the dam portion 22 is set as a second region 52, and the bonding portion 5 may be formed using adhesives of different materials for the respective regions.

In this case, it is preferable that the coefficient of thermal expansion of the resin configuring the second region 52 is smaller than the coefficient of thermal expansion of the resin configuring the first region 51. This is because there is a concern that the resin configuring the second region 52 may affect the in-plane temperature uniformity of the plate-like sample W placed on the electrostatic chuck portion 2.

Both the resins configuring the first region 51 and the second region 52 expand due to heating at the time of use.

If the resin configuring the first region 51 expands, the distance between the electrostatic chuck portion 2 and the flat portion 21 increases. Since a change in position according to this expansion is a direction perpendicular to the in-plane direction of the plate-like sample W, it does not affect the temperature uniformity in the in-plane direction of the plate-like sample W.

In contrast, if the resin configuring the second region 52 expands, the area where the electrostatic chuck portion 2 and the base portion for temperature adjustment 3 come into contact with the resin increases. Since air and resin have different heat transfer coefficients, there is a case where a change in the contact area between the electrostatic chuck portion 2 and the base portion for temperature adjustment 3, and the resin, affects the temperature of the outer peripheral portion of the plate-like sample W. As a result, there is a concern of impeding the temperature uniformity of the vicinity of the outer periphery of the plate-like sample.

Further, it is preferable that the thermal conductivity of the second region 52 is lower than the thermal conductivity of the first region 51.

Here, in a case where the first region 51 is composed of a single resin, the thermal conductivity of the first region 51 means the thermal conductivity of the resin, and in a case where a plurality of resins are mixed in or a filler or the like is contained, the thermal conductivity of the first region 51 means the average thermal conductivity of the materials configuring the first region 51. The thermal conductivity of the second region 52 is also defined in the same manner.

In the electrostatic chuck device 1, in a case of enhancing the in-plane temperature controllability of the plate-like sample W, in principle, it is preferable that heat transferability in a direction perpendicular to the placement surface of the plate-like sample W of the electrostatic chuck device 1 is high and heat transferability in a circumferential direction is low.

On the other hand, in a case of enhancing the in-plane temperature uniformity of the plate-like sample W, in principle, it is preferable that the heat transferability in the direction perpendicular to the placement surface of the plate-like sample W of the electrostatic chuck device 1 is low and the heat transferability in the circumferential direction is high.

If the thermal conductivity of the second region 52 is lower than the thermal conductivity of the first region 51, it is possible to enhance the heat transferability in the vertical direction of the electrostatic chuck device 1 and suppress the outflow of heat from the dam portion 22 having a low temperature in the base portion for temperature adjustment 3, and it is possible to suppress a decrease in the temperature of the outer peripheral portion of the plate-like sample W. Further, it is possible to enhance the temperature uniformity of a wafer which is placed on the electrostatic chuck device.

Further, the second region 52 is present at only the outer peripheral portion of the plate-like sample W when viewed from overhead. For this reason, if the thermal conductivity of the second region 52 is high, the temperature of the outer peripheral portion of the plate-like sample W easily changes or the temperature uniformity of the plate-like sample W decreases.

Further, it is preferable that the Young's modulus of the second region 52 is smaller than the Young's modulus of the first region 51.

Here, in a case where the first region 51 is composed of a single resin, the Young's modulus of the first region 51 means the Young's modulus of the resin, and in a case where a plurality of resins are mixed in or a filler or the like is contained, the Young's modulus of the first region 51 means the average Young's modulus of the materials configuring the first region 51. The Young's modulus of the second region 52 is also defined in the same manner.

The Young's modulus of the second region 52 is relatively small, whereby breakage of the electrostatic chuck device 1 can be avoided. Further, it is possible to further alleviate a difference in coefficient of thermal expansion occurring between the electrostatic chuck portion and the dam portion, and it is possible to further suppress the occurrence of a gap or the like between the electrostatic chuck portion and the dam portion.

The electrostatic chuck portion 2 and the base portion for temperature adjustment 3 change in volume due to a change in temperature. In general, the electrostatic chuck portion 2 expands due to heating, and the base portion for temperature adjustment 3 contracts due to cooling. Since the electrostatic chuck portion 2 is surrounded by the dam portion 22, the degree of freedom of a position in the in-plane direction is small. If the Young's modulus of the second region 52 is small, even if it is not possible to alleviate a volume change by the degree of freedom of a position, the resin functions as a buffering agent and can sufficiently cope with the volume change.

Specifically, as a combination satisfying the relationship as described above, for example, a combination such as a mixture of silicon resin and an AlN filler being used for the first region 51 and silicone resin being used for the second region 52 is conceivable.

The focus ring 6 is an annular member which surrounds the periphery of the first surface 2a (the placement surface for the plate-like sample W) of the electrostatic chuck portion 2. The focus ring 6 is controlled so as to have the same temperature as the plate-like sample W in a treatment process such as plasma etching.

As the material of the focus ring 6, for example, in a case of being used for oxide film etching, polycrystalline silicon, silicon carbide, or the like is suitably used.

Figure 2:
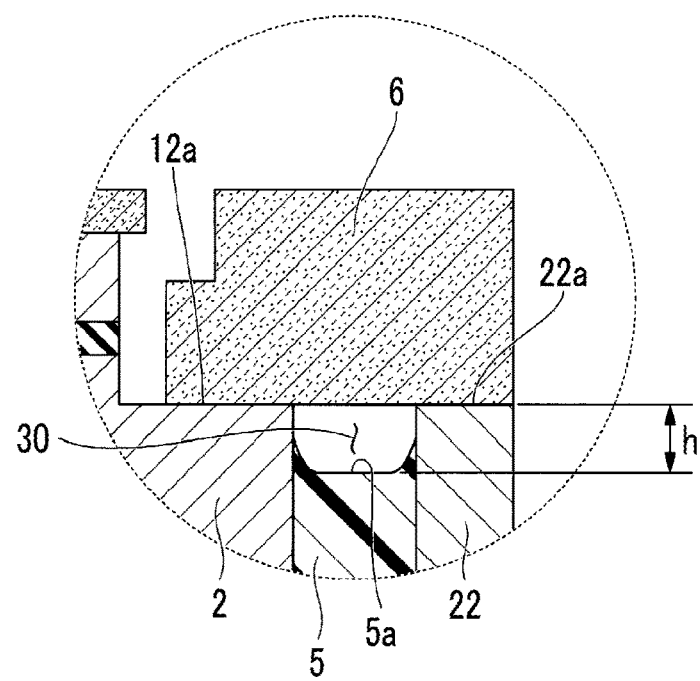
FIG. 2 is an enlarged schematic sectional view of the vicinity of a focus ring in the preferred example of the electrostatic chuck device according to the first embodiment of the present invention.

The focus ring 6 is disposed across the electrostatic chuck portion 2 and the dam portion 22 when viewed from overhead. FIG. 2 is an enlarged schematic sectional view of the vicinity of the focus ring in the electrostatic chuck device according to the first embodiment of the present invention.

As shown in FIG. 2, the focus ring 6 is disposed on the electrostatic chuck portion 2 and the dam portion 22, whereby a space 30 surrounded by the electrostatic chuck portion 2, the focus ring 6, the bonding portion 5, and the dam portion 22 is formed.

The volume of the space 30 is greater than the amount of volume expansion of the bonding portion 5 between the electrostatic chuck portion 2 and the dam portion 22 at the working temperature. In other words, a difference obtained by subtracting the volume of the bonding portion 5 between the electrostatic chuck portion 2 and the dam portion 22 at room temperature, from the volume of the bonding portion 5 between the electrostatic chuck portion 2 and the dam portion 22 at the working temperature, is smaller than the volume of the space 30. Here, the volume of the bonding portion 5 between the electrostatic chuck portion 2 and the dam portion 22 means the volume of a portion which is surrounded by the surface extending from the second surface 2b of the electrostatic chuck portion 2, the side surface of the electrostatic chuck portion 2, and the dam portion 22.

Figure 3:
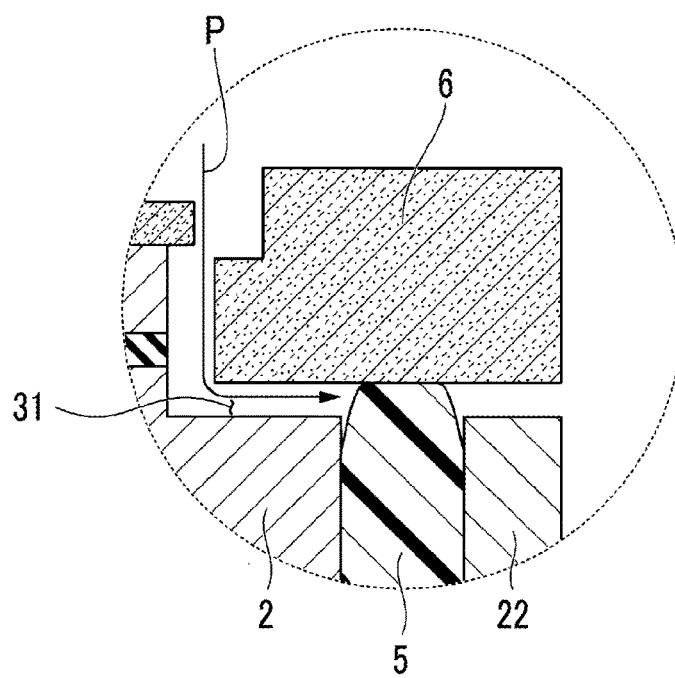
FIG. 3 is an enlarged schematic sectional view of the vicinity of the focus ring in a use aspect of the electrostatic chuck device in a case where the volume of a space formed by an electrostatic chuck portion, the focus ring, a bonding portion, and a dam portion is equal to or less than a predetermined volume.

If the volume of the space 30 is small, as shown in FIG. 3, a part of the bonding portion 5 protrudes from a gap which is formed by the electrostatic chuck portion 2 and the dam portion 22, due to thermal expansion. The protruded part of the bonding portion 5 pushes up the focus ring 6. If the focus ring 6 is pushed up, the focus ring 6 and the peripheral portion of the electrostatic chuck portion 2 which are in close contact with each other are separated from each other, so that a gap 31 is formed.

If the gap 31 is formed, some of plasma P causes corrosion of the bonding portion 5 through the gap 31 in an etching treatment process or the like by plasma when forming a semiconductor large-scale integrated circuit (LSI) or the like. If a part of the bonding portion 5 is corroded by the plasma P, the adhesive force of the portion is lowered, and thus in some cases, breakage of the electrostatic chuck device 1 is caused.

In contrast, if the space 30 has a volume equal to or greater than a predetermined volume, the focus ring 6 is not pushed up by the bonding portion 5. If the focus ring 6 is not pushed up, the bonding portion 5 is not exposed to a plasma environment. For this reason, deterioration of the bonding portion 5 can be suppressed.

A height h of the space 30 in the vertical direction of the electrostatic chuck device 1 is preferably 0.1 mm or more and 0.7 mm or less, and more preferably 0.2 mm or more and 0.3 mm or less. Here, the height h of the space 30 in the vertical direction of the electrostatic chuck device 1 means the distance from the upper surface 12a of the electrostatic chuck portion 2 to the upper surface 5a of the bonding portion 5. Here, the upper surface of the electrostatic chuck portion 2 means the surface where the electrostatic chuck portion 2 and the focus ring 6 are in close contact with each other, and the upper surface of the bonding portion 5 means the upper surface 5a of the bonding portion 5 between the electrostatic chuck portion 2 and the dam portion 22. As shown in FIG. 2, in a case where the height of the upper surface 5a of the bonding portion 5 is not constant due to the surface tension or the like, the height of the perpendicular line drawn from the lowermost point of the upper surface 5a of the bonding portion 5 toward the focus ring 6 is defined as the height h.

If the height h of the space 30 is 0.2 mm or more, it is possible to suppress the bonding portion 5 from pushing up the focus ring 6, regardless of which resin is generally used for the bonding portion 5. For this reason, corrosion of the bonding portion by plasma can be avoided.

Returning to FIG. 1, a temperature sensor 60 is provided on the lower surface side of the heater element 4. In the structure shown in FIG. 1, the installation hole 19 is formed so as to partially penetrate the base portion for temperature adjustment 3 in the thickness direction thereof and the temperature sensor 60 is installed at the uppermost portion of the installation hole 19 and at a position close to the heater element 4.

It is preferable that the temperature sensor 60 is installed at a position as close to the heater element 4 as possible. For this reason, the installation hole 19 may be formed to be extended so as to protrude further toward the electrostatic chuck portion 2 side than in the structure shown in FIG. 1 such that the temperature sensor 60 and the heater element 4 are brought closer to each other.

The temperature sensor 60 is a fluorescent emission type temperature sensor in which a phosphor layer is formed on the upper surface side of a rectangular parallelepiped-shaped light transmission body made of a material having high thermal conductivity (as an example, aluminum or the like). The temperature sensor 60 is bonded to the lower surface side of the heater element 4 by a silicone resin-based adhesive or the like having translucency and heat resistance.

The phosphor layer is made of a material which generates fluorescence in response to heat generation from the heater. As the phosphor layer, a wide variety of fluorescent materials can be selected as long as it is a material generating fluorescence in response to heat generation. As an example, a material appropriately selected from a fluorescent material to which a rare earth element having an energy level suitable for light emission is added, a semiconductor material such as AlGaAs, a metal oxide such as a magnesium oxide, and a mineral such as ruby or sapphire can be used.

The temperature sensor 60 corresponding to the heater element 4 is provided at a position which does not interfere with the power supply terminals 15 and 17 or the like and at a certain position in the circumferential direction of the lower surface of the heater element 4.

A temperature measurement part 62 which measures the temperature of the heater from the fluorescence of the temperature sensor 60 is configured of an excitation unit 63 which irradiates the phosphor layer with excitation light on the outside (the lower side) of the installation hole 19 of the base portion for temperature adjustment 3, a fluorescence detector 64 which detects the fluorescence emitted from the phosphor layer, and a control unit 65 which controls the excitation unit 63 and the fluorescence detector 64 and calculates the temperature of the heater on the basis of the fluorescence, as shown in FIG. 1, as an example.

Further, the electrostatic chuck device 1 has the pin insertion hole 20 provided so as to penetrate from the base portion for temperature adjustment 3 to the placing plate 11 in the thickness direction thereof. A lift pin for removal of the plate-like sample is provided in the pin insertion hole 20. A tubular insulator 20a is provided on the inner peripheral portion of the pin insertion hole 20.

In the electrostatic chuck device 1, with the above configuration, it is possible to suppress the focus ring 6 from being pushed up by a part of the bonding portion 5 due to thermal expansion. As a result, it is possible to prevent the bonding portion 5 from being corroded by plasma and deteriorating.

[Second Embodiment]

Figure 4:
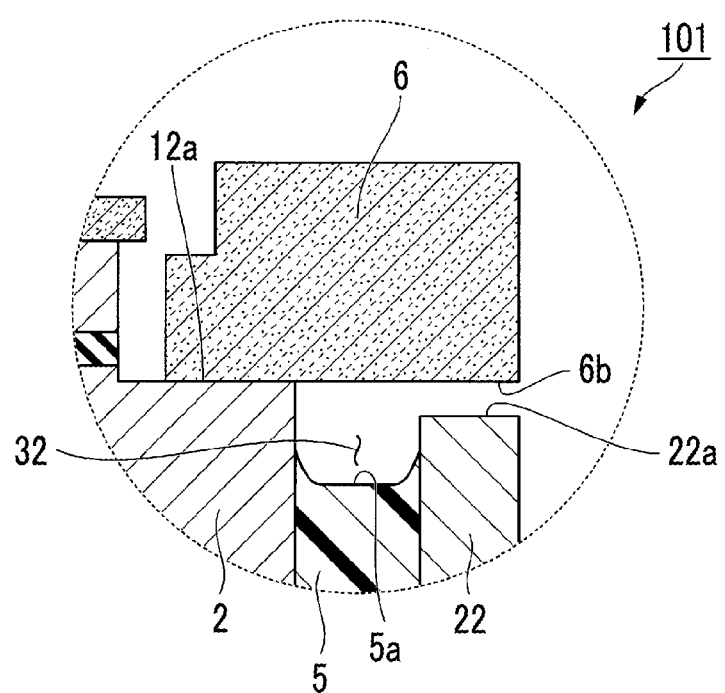
FIG. 4 is an enlarged schematic sectional view of the vicinity of a focus ring in a preferred example of an electrostatic chuck device according to a second embodiment of the present invention.

FIG. 4 is an enlarged schematic sectional view of the vicinity of a focus ring in an electrostatic chuck device according to a second embodiment of the present invention. An electrostatic chuck device 101 according to the second embodiment is different from the electrostatic chuck device 1 according to the first embodiment only in that a space 32 surrounded by the electrostatic chuck portion 2, the focus ring 6, the bonding portion 5, and the dam portion 22 is not a closed space but a partly open space. Accordingly, in the following description, the configuration of the space will be described in detail and the description of parts shared by both the embodiments will be omitted. Further, in the respective drawings which are used for the description, the constituent elements shared by FIGS. 1 to 3 are denoted by the same reference numerals.

In the electrostatic chuck device 101, the focus ring 6 is supported on the upper surface of the periphery of the electrostatic chuck portion 2. For this reason, a gap is formed between the focus ring 6 and the dam portion 22, and a part of the space 32 on the outer periphery side of the focus ring 6 is open.

In this case, the space surrounded by the electrostatic chuck portion 2, the focus ring 6, the bonding portion 5, and the dam portion 22 means a space surrounded by the electrostatic chuck portion 2, the focus ring 6, a surface extending in the vertical direction from the outer surface of the focus ring 6, the bonding portion 5, and the dam portion 22.

The volume of the space 32 is greater than the amount of volume expansion of the bonding portion 5 at the working temperature. For this reason, a part of the bonding portion 5 does not push up the focus ring 6, and thus deterioration of the bonding portion 5 can be suppressed.

As shown in FIG. 4, the focus ring 6 is supported by the periphery of the electrostatic chuck portion 2. That is, a bottom surface 6b of the focus ring 6 and the upper surface 12a of the electrostatic chuck portion 2 are in close contact with each other, and thus an end portion on the inside of the focus ring 6, of the space 32, is not open. As a result, it is possible to prevent radicals generated by plasma treatment from infiltrating from the center side of the electrostatic chuck device to the bonding portion. The plasma is irradiated toward the wafer placed on the central portion of the electrostatic chuck device. For this reason, by preventing infiltration of the radicals from the center side of the electrostatic chuck device, it is possible to further suppress corrosion of the bonding portion.

The plasma treatment is performed toward the plate-like sample W disposed inside the focus ring 6 when viewed from overhead. For this reason, even if the generated plasma infiltrates from the inside of the focus ring 6 toward the bonding portion 5, it hardly infiltrates from the outer periphery side of the focus ring 6. That is, even in the space 32 where a part of the outer periphery side of the focus ring 6 is open, it is possible to sufficiently suppress the infiltration of the plasma to the bonding portion 5.

In the electrostatic chuck device 101, with the above configuration, it is possible to suppress the focus ring 6 from being pushed up by a part of the bonding portion 5 due to thermal expansion. As a result, it is possible to prevent the bonding portion 5 from being corroded by plasma and deteriorating.

[Third Embodiment]

Next, a third embodiment of the present invention will be described. However, description will be made with a focus on the differences from the first embodiment and the second embodiment, and with respect to the same matters, description thereof will be omitted.

(Electrostatic Chuck Device)

It is preferable that the coefficient of thermal expansion of the first region 51 is smaller than the coefficient of thermal expansion of the second region 52.

This is because there is a high possibility that the first region 51 may affect the in-plane temperature uniformity of the plate-like sample W placed on the electrostatic chuck portion 2. For example, in a case where the first region 51 is made of silicone resin having fillers and the second region 52 is made of silicone resin having no fillers, since the first region 51 has the fillers having a small coefficient of thermal expansion, the coefficient of thermal expansion of the first region 51 becomes smaller than the coefficient of thermal expansion of the second region 52.

Further, it is preferable that the first region 51 has the fillers therein, and it is preferable that the second region 52 does not have fillers therein.

The fillers are used in order to enhance, for example, mechanical or thermal properties (thermal conductivity or the like). If the first region 51 has the fillers therein, it is possible to enhance the thermal conductivity of the electrostatic chuck device 1 in the vertical direction. As a result, even in a case where the temperature of the plate-like sample W becomes too high, it is possible to efficiently exhaust heat through the base portion for temperature adjustment 3. Further, it is possible to avoid a problem such as only the temperature of a specific portion in the in-plane direction of the plate-like sample W being increased by the heater element 4. Since the first region of the bonding portion is not exposed to the outside, it is not affected by the radicals which are generated during the plasma treatment.

In contrast, if the thermal conductivity of the second region 52 is high, the temperature of the outer peripheral portion of the plate-like sample W is lowered by the dam portion 22 of the base portion for temperature adjustment 3, and thus the temperature uniformity in the in-plane direction of the plate-like sample W decreases. Further, since a part of the second region 52 is exposed to the outside, the second region 52 is easily affected by the radicals which are generated during the plasma treatment. If the filler reacts with the radical, the filler can become a particle generation source. For this reason, the second region 52 does not have fillers therein, whereby contamination of the wafer during the plasma treatment can be avoided.

As the fillers, known fillers can be used. For example, particles or the like of aluminum oxide ($Al_2O_3$), aluminum nitride (AlN), yttrium oxide ($Y_2O_3$), or a combination thereof can be used. It is possible to use a particle in a range of, for example, about 10 nanometers to about 10 micrometers, as the diameter of the filler. The fillers may account for a range of about 50% to about 70% of the total volume of the first region 51.

The preferred embodiments of the present invention have been described above with reference to the accompanying drawings. However, the present invention is not limited to such examples. The shapes, combinations, or the like of the respective constituent members shown in the above-described examples are merely examples, and various modifications can be made based on design requirements or the like within a scope which does not depart from the gist of the present invention.

INDUSTRIAL APPLICABILITY

The present invention can provide an electrostatic chuck device having high plasma resistance. Further, the present invention can provide an electrostatic chuck device having high temperature uniformity in an in-plane direction.

REFERENCE SIGNS LIST

W: plate-like sample
1: electrostatic chuck device
2: electrostatic chuck portion
2a: first surface
2b: second surface
3: base portion for temperature adjustment
21: flat portion
22: dam portion
3A: flow path
4: heater element
5: bonding portion
51: first region
52: second region
6: focus ring
7: adhesive layer
11: placing plate
11a: protrusion portion
12: supporting plate
13: electrode for electrostatic chucking
14: insulating material layer
15, 17: power supply terminal
15a, 17a, 19a, 20a: insulator
16, 18: through-hole
19: installation hole
20: pin insertion hole
30, 32: space
31: gap
60: temperature sensor
62: temperature measurement part
63: excitation unit
64: fluorescence detector
65: control unit

The invention claimed is:

1. An electrostatic chuck device, comprising:
an electrostatic chuck portion having a placement surface on which a plate-like sample is placed and an internal electrode for electrostatic chucking;
a base portion for temperature adjustment arranged in opposition to the side of the electrostatic chuck portion on the opposite side from the placement surface;
a bonding portion that bonds the electrostatic chuck portion and the base portion for temperature adjustment; and
an annular focus ring that surrounds the periphery of the placement surface; wherein,
the base portion for temperature adjustment has a flat portion on which the electrostatic chuck portion is placed, and a dam portion surrounding the periphery of the electrostatic chuck portion,
the focus ring is arranged extending across the electrostatic chuck portion and the dam portion when viewed from overhead,
the bonding portion bonds the dam portion and the side of the electrostatic chuck portion,
the upper surface of the bonding portion between the dam portion and the electrostatic chuck portion is arranged below the upper surface of the electrostatic chuck portion and the dam portion,
a space is formed surrounded by the electrostatic chuck portion, the focus ring, the bonding portion and the dam portion, and
the volume of the space is greater than the amount of volume expansion of the bonding portion at the working temperature.

2. The electrostatic chuck device according to claim 1, wherein the distance from the upper surface of the electrostatic chuck portion to the upper surface of the bonding portion is 0.1 mm or more.

3. The electrostatic chuck device according to claim 1, wherein the upper surface of the electrostatic chuck portion is arranged above the upper surface of the dam portion, and the focus ring is supported by the upper surface of the peripheral edge of the electrostatic chuck portion.

4. The electrostatic chuck device according to claim 1, wherein the bonding portion has a first region between the electrostatic chuck portion and the flat portion and a second region between the electrostatic chuck portion and the dam portion, and Young's modulus of the second region is smaller than Young's modulus of the first region.

5. The electrostatic chuck device according to claim 4, wherein thermal conductivity of the second region is lower than thermal conductivity of the first region.

6. An electrostatic chuck device, comprising:
an electrostatic chuck portion having a placement surface on which a plate-like sample is placed and an internal electrode for electrostatic chucking;
a base portion for temperature adjustment arranged in opposition to the side of the electrostatic chuck portion on the opposite side from the placement surface; and
a bonding portion that bonds the electrostatic chuck portion and the base portion for temperature adjustment; wherein,
the base portion for temperature adjustment has a flat portion on which the electrostatic chuck portion is placed, and a dam portion surrounding the periphery of the electrostatic chuck portion,
the bonding portion is arranged extending from between the electrostatic chuck portion and the flat portion to between the electrostatic chuck portion and the dam portion, and
in the bonding portion, thermal conductivity of a first region between the electrostatic chuck portion and the flat portion is higher than thermal conductivity of a second region between the electrostatic chuck portion and the dam portion in the bonding portion.

7. The electrostatic chuck device according to claim 6, wherein the first region of the bonding portion has a filler, while the second region of the bonding portion does not have a filler.

8. The electrostatic chuck device according to claim 6, wherein Young's modulus of the second region of the bonding portion is smaller than Young's modulus of the first region of the bonding portion.

9. The electrostatic chuck device according to claim 6, further having a focus ring arranged above the electrostatic chuck portion and the dam portion and provided around the placement surface along the circumferential direction of the placement surface, wherein
the upper surface of the bonding portion in the second region is arranged below the upper surface of the electrostatic chuck portion and the upper surface of the dam portion.

10. The electrostatic chuck device according to claim 9, wherein the upper surface of the electrostatic chuck portion is arranged above the upper surface of the dam portion and the focus ring is supported by the upper surface of the peripheral edge of the electrostatic chuck portion.

11. The electrostatic chuck device according to claim 10, wherein a space is formed surrounded by the electrostatic chuck portion, the focus ring, the bonding portion and the dam portion, and
    the volume of the space is greater than the amount of volume expansion of the bonding portion at the working temperature.

\* \* \* \* \*